(12) United States Patent
Ushiyama et al.

(10) Patent No.: US 7,361,975 B2
(45) Date of Patent: Apr. 22, 2008

(54) SEMICONDUCTOR INTEGRATED CIRCUIT HAVING REDUCED CROSS-TALK NOISE

(75) Inventors: Kenichi Ushiyama, Kawasaki (JP); Shigenori Ichinose, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/914,141

(22) Filed: Aug. 10, 2004

(65) Prior Publication Data

US 2005/0006780 A1    Jan. 13, 2005

Related U.S. Application Data

(62) Division of application No. 10/694,997, filed on Oct. 29, 2003, which is a division of application No. 09/963,469, filed on Sep. 27, 2001, now Pat. No. 6,664,638.

(30) Foreign Application Priority Data

Dec. 20, 2000  (JP) ............................. 2000-387890

(51) Int. Cl.
*H01L 39/00* (2006.01)
(52) U.S. Cl. .................. 257/662; 257/664; 257/659
(58) Field of Classification Search ................ 257/508, 257/659, 662, 664
See application file for complete search history.

(56) References Cited

U.S. PATENT DOCUMENTS

| 3,698,082 | A | * | 10/1972 | Hyltin et al. ................. 29/856 |
| 4,514,749 | A | * | 4/1985 | Shoji .......................... 257/664 |
| 5,594,279 | A | | 1/1997 | Itou et al. .................... 257/758 |
| 5,610,403 | A | | 3/1997 | Kingsley et al. ........ 250/370.09 |
| 6,218,631 | B1 | | 4/2001 | Hetzel et al. ................ 174/261 |
| 6,278,148 | B1 | | 8/2001 | Watanabe et al. ........... 256/296 |
| 6,344,667 | B1 | * | 2/2002 | Miyagi ........................ 257/207 |
| 6,396,150 | B2 | | 5/2002 | Kohno |
| 6,510,545 | B1 | | 1/2003 | Yee et al. ...................... 716/12 |
| 6,580,486 | B1 | | 6/2003 | Sekine ........................ 349/139 |

FOREIGN PATENT DOCUMENTS

| JP | 06-029393 A | 2/1994 |
| JP | 06-069210 | 3/1994 |
| JP | 07-030080 A | 1/1995 |
| JP | 10-135337 A | 5/1998 |
| JP | 10-214941 A | 8/1998 |
| JP | 2000-68276 A | 3/2000 |
| JP | 2001-345385 A | 12/2001 |

* cited by examiner

*Primary Examiner*—Theresa T Doan
(74) *Attorney, Agent, or Firm*—Arent Fox, LLP.

(57) ABSTRACT

A semiconductor integrated circuit, includes a shielded wire line and a shielding wire line provided for the shielded wire line and divided into a plurality of segments in a longitudinal direction of the shielded wire line.

1 Claim, 7 Drawing Sheets

ΔDelay

```
┌─────────────────┐
│ SEARCH FOR      │──ST201
│ PARALLEL WIRE LINES│         ┌──────────────────────────────┐
└─────────────────┘◄──────────►│ TABLE OR FORMULA INDICATING  │
         │                     │ RELATIONSHIP BETWEEN         │
         ▼                     │ LENGTH OF PARALLEL WIRE LINE │
┌─────────────────┐             │ AND LENGTH OF NECESSARY      │
│ DETERMINE LENGTH OF│──ST202   │ SHIELDING WIRE LINE          │
│ SHIELDING WIRE LINE│          └──────────────────────────────┘
└─────────────────┘
         │
         ▼
```

FIG.10

| | | NECESSARY SHIELDING WIRE LINE | | | | | | |
|---|---|---|---|---|---|---|---|---|
| | | 10 | 9 | 8 | 7 | 6 | 5 | 4 |
| LENGTH OF PARALLEL WIRE LINE | 10 | 85% | 85% | 85% | 85% | 75% | 65% | |
| | 9 | • | • | • | • | • | | |
| | 8 | • | • | • | • | • | | |
| | • | • | • | • | | | | |
| | • | | | | | | | |

SEMICONDUCTOR INTEGRATED CIRCUIT HAVING REDUCED CROSS-TALK NOISE

This is a Division of application Ser. No. 10/694,997 filed Oct. 29, 2003, which is a Divisional of Application No. 09/963,469 filed Sep. 27, 2001 now U.S. Pat. No. 6,664,638. The disclosure of the prior application(s) is hereby incorporated by reference herein in its entirety.

BACKGROUND OF THE INVENTION

1. Field of the Invention

The present invention generally relates to semiconductor integrated circuits, and particularly relates to a semiconductor integrated circuit which has cross-talk noise thereof reduced by shielding wire lines.

2. Description of the Related Art

In electric circuits, inductance coupling and capacitance coupling between signal lines cause cross-talk noise. The greater the inductance coupling and capacitance coupling between lines, the greater the cross-talk noise is. In semiconductor devices such as large-scale integrated circuits, inductance coupling and capacitance coupling between lines increase as the circuit density increases, thereby causing noise to appear more conspicuously. In order to reduce cross-talk noise caused by the inductance and capacitance coupling, shielding wire lines are used.

Use of shielding wire lines gives rise to problems in that they have relatively large wiring resistance per unit length.

First, large wiring resistance results in electric charging and discharging in the shielding wire lines being slowed, thereby reducing a shielding effect.

Second, when a shielding wire line is connected to the ground voltage or to the power supply voltage at several points along the line, an excessively large current runs through the shielding wire line, causing the problem of E-MIG (electro migration). The E-MIG occurs when the gradient of a power supply voltage in the LSI is ignored. For example, the power supply voltage differs between a point close to the power supply pin of the LSI and the center point of the LSI. If a shielding wire line is laid out between the points having a voltage difference, and is clipped to the power supply voltage at two end points thereof, an excessively large current ends up running through the shielding wire line. In order to circumvent this, analysis of power supply networks may be conducted to detect points where requirements of current density are not met, followed by making corrections one by one. Since there is no guarantee that this will converge, a time spent on the process of analyzing and making corrections would be regarded as a problem, especially when the speed of product development is given high priority.

Third, conventional shielding is made by providing a shield along all the extent of a shielded line. As a result, shielding wire lines consumes a wiring area to a large extent, giving rise to a problem in that an efficient layout becomes difficult to achieve. To obviate this, such measures as increasing the number of wiring layers or enlarging chip size may be conceivable. It is desirable, however, to provide efficient shielding wire lines under the given limitations of the number of wiring layers and chip size.

Accordingly, there is a need for a method of laying out effective and efficient shielding wire lines and a semiconductor integrated circuit that has effective and efficient shielding wire lines.

SUMMARY OF THE INVENTION

It is a general object of the present invention to provide a semiconductor integrated circuit that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor integrated circuit particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor integrated circuit, including a shielded wire line and a shielding wire line provided for the shielded wire line and divided into a plurality of segments in a longitudinal direction of the shielded wire line.

In the invention described above, the shielding wire line is divided into a plurality of segments, which makes smaller an effect of wiring resistance, thereby speeding up the electric charging and discharging of the shielding wire line. This improves the shielding effect. Further, division into the plurality of segments eliminates a need to connect a shielding wire line to a power supply potential or a ground potential at two positions far apart in the semiconductor integrated circuit. This obviates the problem of E-MIG.

According to another aspect of the present invention, the semiconductor integrated circuit as described above is such that at least one of the plurality of segments is connected to a first power supply potential, and remaining ones of the plurality of segments are connected to a second power supply potential different from the first power supply potential.

In the invention described above, the shielding wire line provided for the shielded wire line is connected to both the power supply potential and the ground potential. This configuration allows clippings to be made at a relatively large number of points, compared with a configuration in which shielding wire lines provided for a shielded wire line are connected to only either the ground potential line or the power supply potential line as in the case of conventional shielding wire lines. Provision of clippings at a larger number of points makes an effect of wire resistance lower, thereby increasing a shielding effect.

According to another aspect of the present invention, the semiconductor integrated circuit as described above is such that at least one of the plurality of segments is connected to a power supply potential only at a single connection point.

In the invention described above, the shielding wire line provided for the shielded wire line is divided into the plurality of shielding segments, each of which is fixed to a certain potential at a single clipping position. Since each shielding segment is provided with a potential through a single clipping position, the problem of E-MIG is eliminated.

Further, the present invention provides a semiconductor integrated circuit, including a shielded wire line and a shielding wire line provided for the shielded wire line and having a width broader than that of the shielded wire line.

Moreover, the present invention provides semiconductor integrated circuit, includes a shielded wire line and a plurality of shielding wire lines provided for the shielded wire line on one side of the shielded wire line.

Use of a broader shielding wire line or multiple shielding wire lines improves an shielding effect.

According to another aspect of the present invention, a semiconductor integrated circuit includes a shielded wire line and a shielding wire line provided along only a portion of an entire extent of the shielded wire line.

In the invention described above, a shielding wire line is provided only for a portion of an entire extent of the shielded wire line, thereby achieving shield wiring that makes an efficient use of wiring areas.

Further, the semiconductor integrated circuit as described above further includes a driver that transmits a signal to the shielded wire line, wherein the portion of the entire extent of the shielded wire line along which the shielding wire line is provided is a portion on a side of the driver.

In the invention described above, the shielding wire line is provided only for a portion of the entire extent of the shielded wire line on a side of the driver. A signal propagating through the shielded wire line has such a rising edge that the closer it is to the driver, the steeper the slope is. Accordingly, the effect of cross-talk noise that the shielded wire line on the noise source side has on the shielded wire line on the noise recipient side is the strongest near the driver, and becomes increasingly weak as it increases the distance from the driver and comes closer to the receiver. If a portion of the extent of the shielded wire line is shielded on the side of the driver, therefore, the effect of cross-talk noise can be sufficiently reduced.

DESCRIPTION OF THE PREFERRED EMBODIMENTS

In the following, embodiments of the present invention will be described with reference to the accompanying drawings.

Figure 1A:
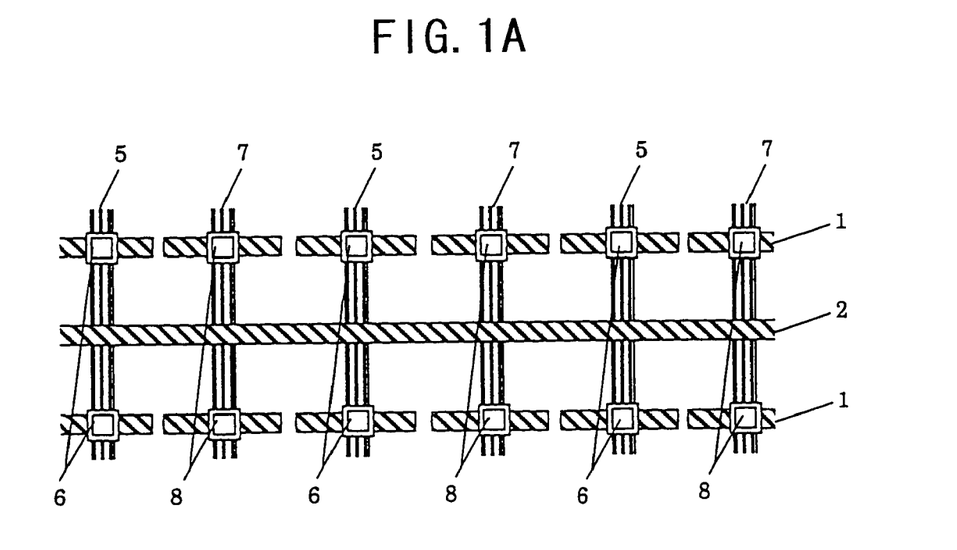
FIGS. 1A and 1B are drawings for explaining a semiconductor integrated circuit that has a shielding wire line provided according to a first embodiment of the present invention
Figure 1B:
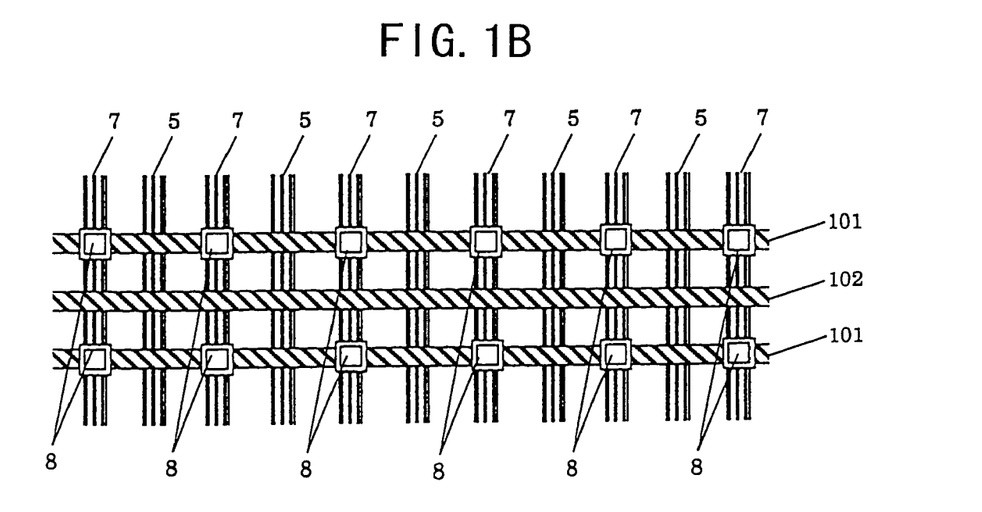

FIGS. 1A and 1B are drawings for explaining a semiconductor integrated circuit that has a shielding wire line provided according to a first embodiment of the present invention. FIG. 1A shows a portion of shielding wire lines of a semiconductor integrated circuit laid out according to the present invention, and FIG. 1B shows a layout of conventional and typical shielding wire lines for the comparison purpose.

As shown in FIG. 1A, in the present invention, shielding wire lines 1 are provided for a shielded wire line 2. The shielding wire lines 1 are each divided into a plurality of shielding segments. Each shielding segment is connected to a power supply potential line 5 or to a ground potential line 7. Here, connections between wire lines are made through contacts 6 or 8.

In the present invention as described above, a shielding wire line 1 provided for the shielded wire line 2 is connected to both the power supply potential line 5 and the ground potential line 7. The present invention allows clipping (connections) to be made at a relatively large number of points, compared with a configuration in which shielding wire lines 101 provided for a shielded wire line 102 are connected only to the ground potential line 7 and not to the power supply potential line 5 as in the case of conventional shielding wire lines shown in FIG. 1B. Provision of clippings at a larger number of points makes an effect of wire resistance lower, thereby increasing a shielding effect. Namely, wire resistance is reduced, so that electric charging and discharging in the shielding wire lines become faster, resulting in a larger shielding effect.

In the present invention, further, a shielding wire line 1 provided for the shielded wire line 2 is divided into the plurality of shielding segments, each of which is fixed to a certain potential at a single clipping position. Since each shielding segment is provided with a potential through a single clipping position, the problem of E-MIG is eliminated.

Figure 2:
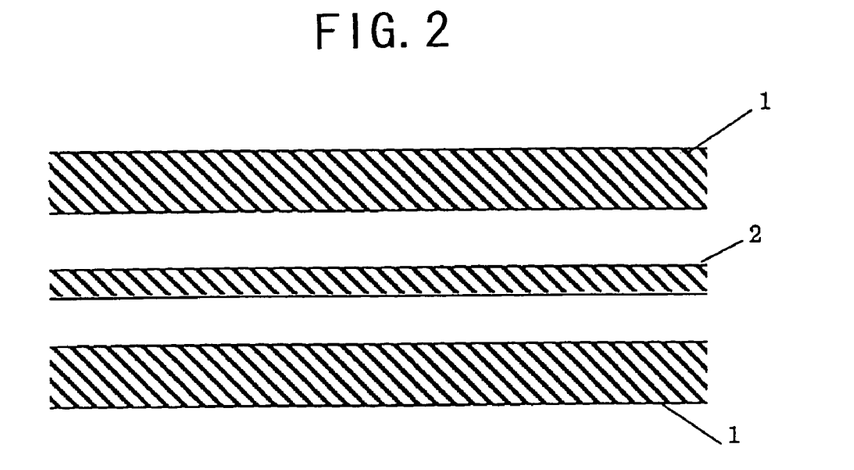
FIG. 2 is a drawing showing a variation of shielding wire lines according to the present invention.

FIG. 2 is a drawing showing a variation of shielding wire lines according to the present invention. In FIG. 2, the shielding wire lines 1 are designed to have a broader widths than the shielded wire line 2. Enlargement of the width of the shielding wire lines 1 makes it possible to reduce wiring resistance, thereby enhancing the shielding effect. Namely, a reduction in the wiring resistance results in electric charging and discharging of the shielded wire lines being faster, further resulting in the increase of shielding effects.

Figure 3:
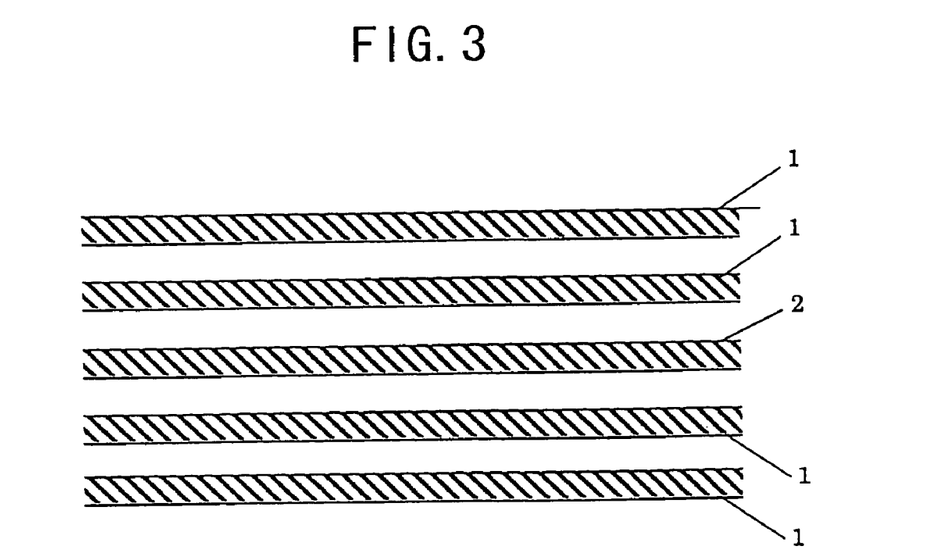
FIG. 3 is a drawing showing a variation of shielding wire lines according to the present invention.

FIG. 3 is a drawing showing a variation of shielding wire lines according to the present invention. In FIG. 3, a plurality of shielding wire lines 1 are provided for a single shielded wire line 2 on both sides thereof (or on one side thereof). Arranging the multiple shielding wire lines 1 adds to the shielding effect.

Figure 4:
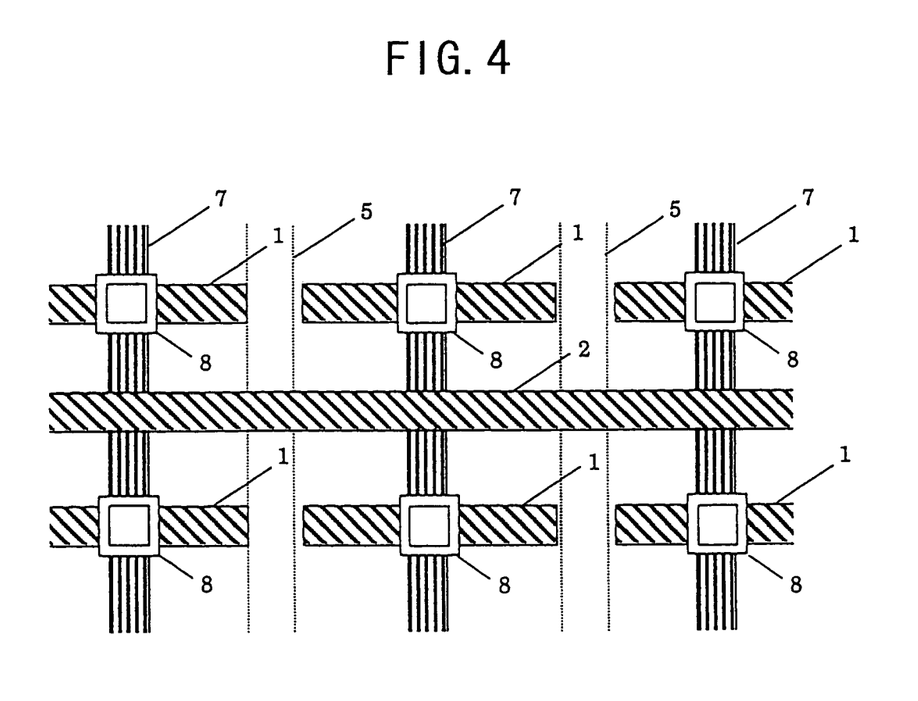
FIG. 4 is a drawing showing a further variation of the shielding wire lines according to the present invention.

FIG. 4 is a drawing showing a further variation of the shielding wire lines according to the present invention. In FIG. 4, the shielding wire lines 1 provided for the shielded wire line 2 are divided into a plurality of shielding segments. Each shielding segment is connected to the ground potential line 7, for example. Here, connections between the wire lines are made through contacts 8.

In the configuration of FIG. 4 described above, the shielding wire lines 1 provided for the shielded wire line 2 are each divided into a plurality of shielding segments, each of which is fixed to a certain potential at a single clipping point. Applying of potential to each shielding segment through a single clipping point eliminates the problem of E-MIG. In the example of FIG. 4, each shielding segment is connected to the ground potential line 7, but may as well be connected to the power supply potential line 5. In this manner, all the shielding segments may be connected to only either the power supply potential lines 5 or the ground potential lines 7 as shown in FIG. 4, rather than connected to both the power supply potential lines 5 and the ground potential lines 7 as shown in FIG. 1. This configuration as well obviates the problem of E-MIG.

Figure 5:
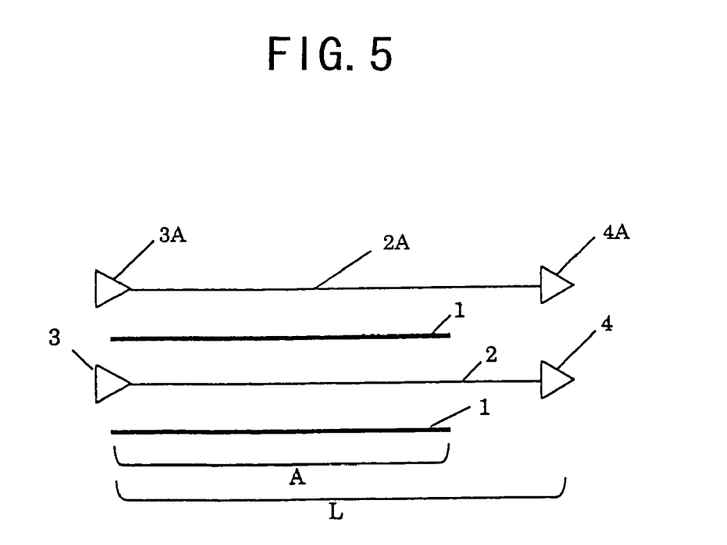
FIG. 5 is a drawing for explaining a semiconductor integrated circuit having shielding wire lines according to a second embodiment of the present invention.

FIG. 5 is a drawing for explaining a semiconductor integrated circuit having shielding wire lines according to a second embodiment of the present invention.

In FIG. 5, the shielded wire line 2 is driven by a driver 3, and is provided with the shielding wire lines 1. As shown in FIG. 5, the second embodiment of the present invention provides the shielding wire line 1 such that it shields only a portion of the entire extent L of the shielded wire line 2 on the side of the driver 3.

Figure 6A:
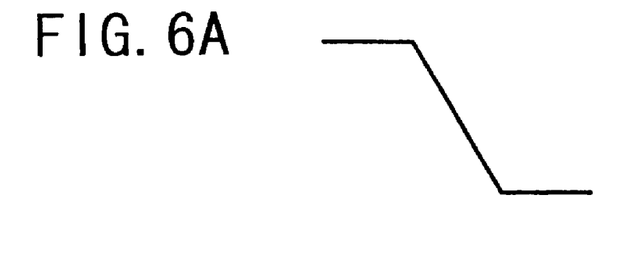
FIGS. 6A through 6C are drawings for explaining a shielding effect obtained when only a portion of the extent of the shielded wire line is shielded on the side nearer to the driver.
Figure 6B:
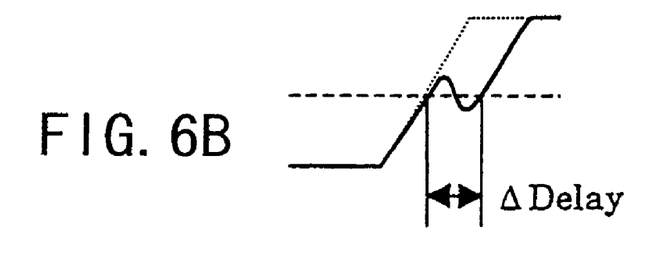
Figure 6C:
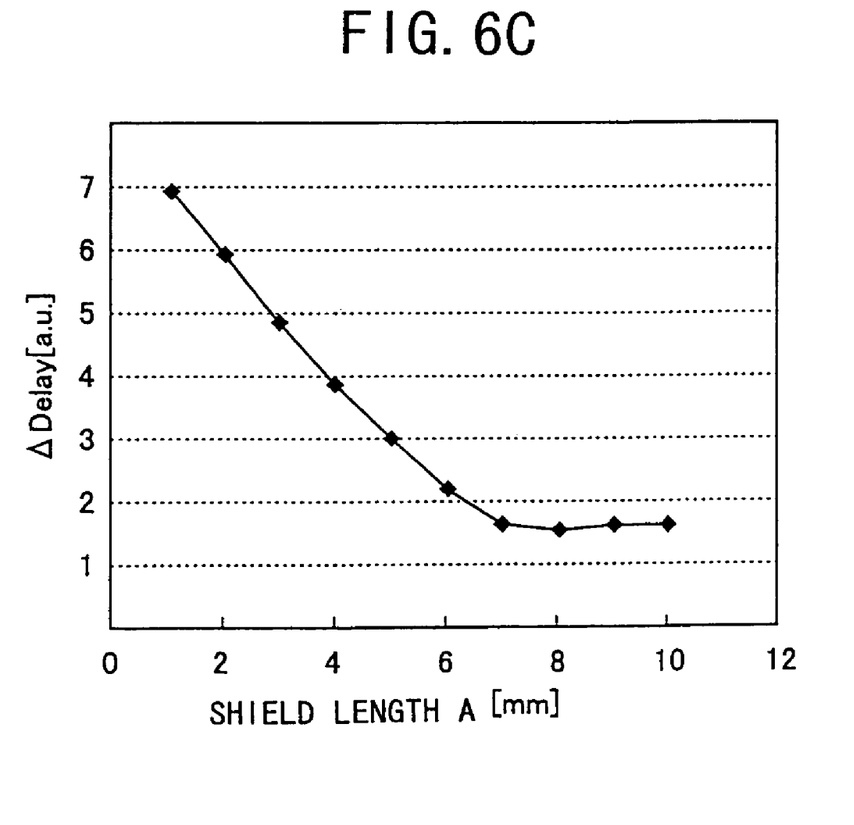

FIGS. 6A through 6C are drawings for explaining a shielding effect obtained when only a portion of the extent of the shielded wire line is shielded on the side nearer to the driver.

FIG. 6A illustrates a signal that is supplied by a driver 3A to a shielded wire line 2A laid out parallel to the shielded wire line 2 of FIG. 5, and shows the signal on the noise source side. FIG. 6B illustrates a voltage waveform of a signal that is received by a receiver 4 as it is supplied from the driver 3 through the shielded wire line 2 of FIG. 5, and shows the signal on the noise recipient side. As shown in FIG. 6A, a signal dropping to LOW is supplied from the driver 3A to a receiver 4A through the shielded wire line 2A that extends parallel to the shielded wire line 2. When a signal rising to HIGH is supplied from the driver 3 to the shielded wire line 2 of FIG. 5, as shown in FIG. 6B, the voltage waveform of a signal received at the receiver 4 shows a delay ΔDelay due to cross-talk noise caused by the signal change of the shielded wire line 2A.

FIG. 6C shows an example of the relationship between the delay ΔDelay and the length of the shielding wire line 1 provided on the side of the driver 3 for the purpose of shielding a portion of the extent of the shielded wire line 2 when the length L of the shielded wire line 2 of FIG. 5 is 10 mm. The signal propagating through the shielded wire line has such a rising edge that the closer it is to the driver, the steeper the slope is. Accordingly, the effect of cross-talk noise that the shielded wire line on the noise source side has on the shielded wire line on the noise recipient side is the strongest near the driver, and becomes increasingly weak as it increases the distance from the driver and comes closer to the receiver. If a portion of the extent of the shielded wire line 2 is shielded on the side of the driver 3, therefore, the effect of cross-talk noise can be sufficiently reduced.

In the example of FIG. 6C, when approximately 70% (7 mm) of the total length of 10 mm of the shielded wire line 2 is shielded, the delay ΔDelay caused by cross-talk noise is substantially equal to that of the case in which the entirety of the shielded wire line 2 is shielded. Namely, in this example, a 70% shield length can achieve a delay reduction that is substantially the same as the 100% shield length. Further, if it is desired to set the delay ΔDelay to about 4, a shield that is 4 mm in length may be provided as can be seen from the figure.

At the stage of laying out shielding wire lines during the circuit design process, the relationship between the shield length and the delay time as shown in FIG. 6C may be provided as a table or a formula approximating the relationship where coupling capacitance and resistance may be provided as parameters. Such a table and an approximating formula may be provided as a library, and this library may be used to efficiently layout shielding wire lines. Details of shielding wire line layout will be described later.

In the second embodiment of the present invention as described above, a shielding wire line is provided only for a portion of the entire extent of the shielded wire line, thereby making it possible to arrange shielding wire lines that make efficient use of wiring areas compared with the related art. Further, the length of the shielding wire lines can be adjusted according to the extent of desired delay reduction, so that use of the wiring areas can be optimized, thereby significantly improving the layout efficiency.

Figure 7:
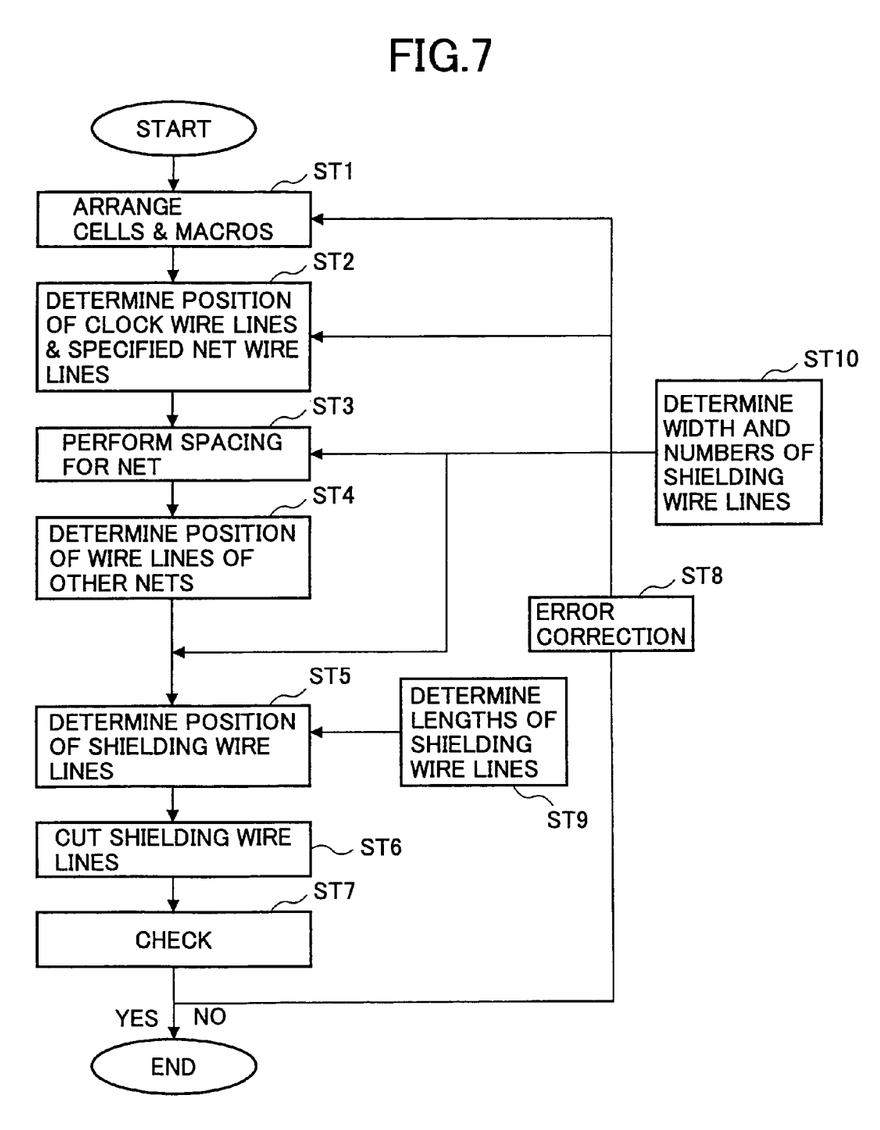
FIG. 7 is a flowchart of a process performed when the method of laying out shielding wire lines according to the present invention is applied to CAD.

FIG. 7 is a flowchart of a process performed when the method of laying out shielding wire lines according to the present invention is applied to CAD (computer aided design).

As major differences when compared with a typical process flow of a conventional CAD system, the method of laying out shielding wire lines according to the present invention is applied to step ST5 of laying out shielding lines, step ST6 of cutting shielding wire lines, step ST9 of determining lengths of shielding wire lines, and step ST10 of determining widths and numbers of shielding wire lines.

In FIG. 7, at step ST1, the arrangement of cells and macros is determined.

At step ST2, the positions of clock-signal lines and specified nets (specified wire line networks: wire lines necessary to be provided with shields) are determined.

At step ST3, spacing is performed with respect to the specified nets so as to secure wiring areas necessary for shielding wire lines. Further, step ST10 is performed to determine widths and numbers of shielding wire lines. Details of the step ST10 will be described later.

At step ST4, the positions of wire lines of other nets are determined.

At step ST5, the positions of shielding wire liens are determined. Further, step ST9 is performed to determine lengths of the shielding wire lines. Details of the step ST9 will be described later.

At step ST6, the shielding wire lines are cut. That is, the shielding wire lines are divided into a plurality of shielding segments at appropriate positions. This provides the advantages that were described in connection with FIG. 1 and/or FIG. 4. Namely, provision of clippings at many positions reduces the effect of wiring resistance, and makes faster the electric charging and discharging of the shielding wire lines, thereby enhancing the shielding effect. Further, division into a plurality of shielding segments and connecting each shielding segment to a fixed potential at a single clipping point can eliminate the problem of E-MIG.

At step ST7, a circuit check is made by use of tools. If check results are not proper, errors are corrected at step ST8. After correction of errors, the procedure goes back to step ST1 or step ST2 to redesign the circuit, starting from a relevant designing stage. If the check results are proper, the procedure comes to an end.

Figure 8:
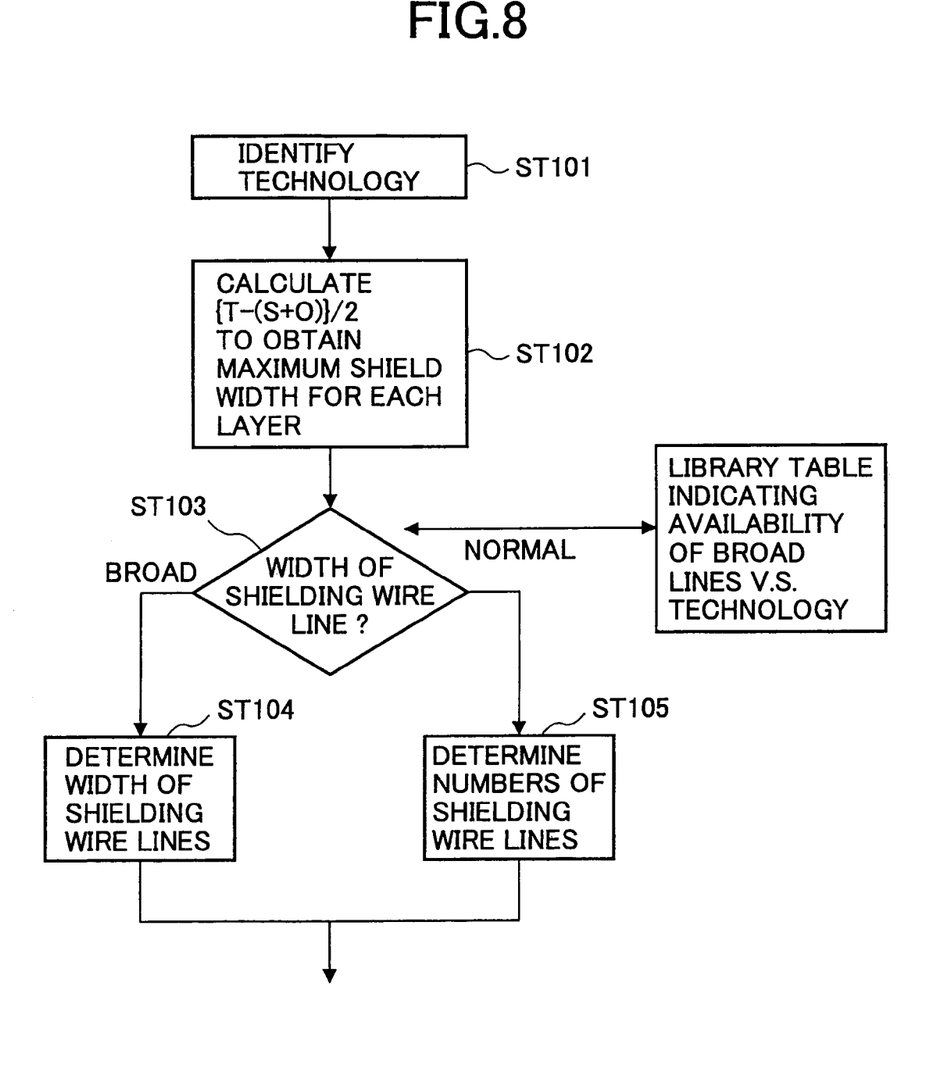
FIG. 8 is a flowchart of a process of determining widths and numbers of shielding wire lines (ST10) shown in FIG. 7.

FIG. 8 is a flowchart of a process of determining widths and numbers of shielding wire lines (ST10) shown in FIG. 7.

At step ST101, a technology used for manufacturing the semiconductor integrated circuit is identified.

At step ST102, {T−(S+O)}/2 is calculated with respect to each wiring layer of the semiconductor integrated circuits, thereby obtaining a maximum shield width. Here, T is a total number of tracks, S the number of shielded nets, and O the number of other nets. The obtained maximum shield width indicates a maximum width that can be used for shielding wire lines.

At step ST103, a decision is made as to whether the width of shielding wire lines is set to a broader width or to a normal width. A table is provided that indicates whether broader width wire lines are usable with respect to each technology used for manufacturing of semiconductor integrated circuits, and a library including this table is referred to when deciding whether the broader width wire lines are available in the technology that is identified at step ST101. If the broader width is available, the procedure goes to step ST104. Otherwise, the procedure goes to step ST105.

At step ST104, the width of shielding wire lines is determined. This decision is made by referring to the maximum shield width obtained at step ST102.

At step ST105, the number of shielding wire lines is determined. This decision is made by referring to the maximum shield width obtained at step ST102.

In this manner, the step of determining widths and numbers of shielding wire lines (ST10 of FIG. 7) is carried out and completed.

Figure 9:
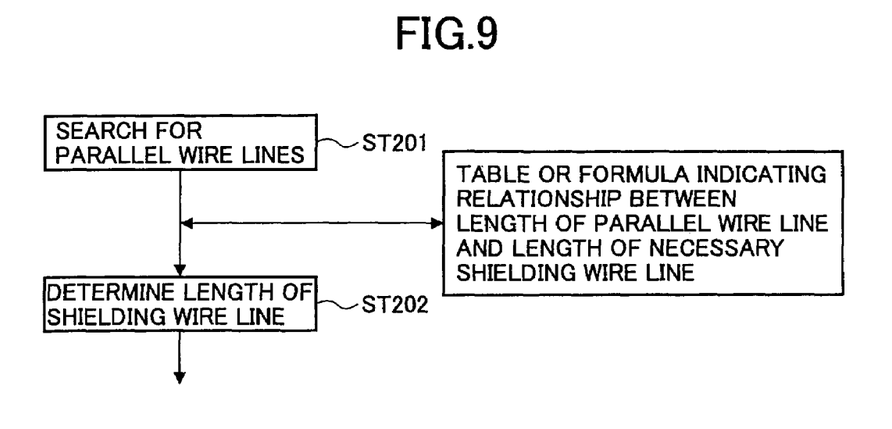
FIG. 9 is a flowchart of the step of determining lengths of shielding wire lines (ST9) shown in FIG. 7.

FIG. 9 is a flowchart of the step of determining lengths of shielding wire lines (ST9) shown in FIG. 7.

At step ST201, parallel wire lines are searched for based on net information. This is a step of detecting portions where the shielded wire lines and shielding wire lines run parallel to each other.

At step ST202, the lengths of shielding wire lines are determined. Here, a table is provided as a library such that the table indicates the relationships between the length of parallel wire lines and the length of necessary shielding wire lines, and this library is referred to when determining the length of shielding wire lines necessary for achieving a desired shielding effect.

Figure 10:
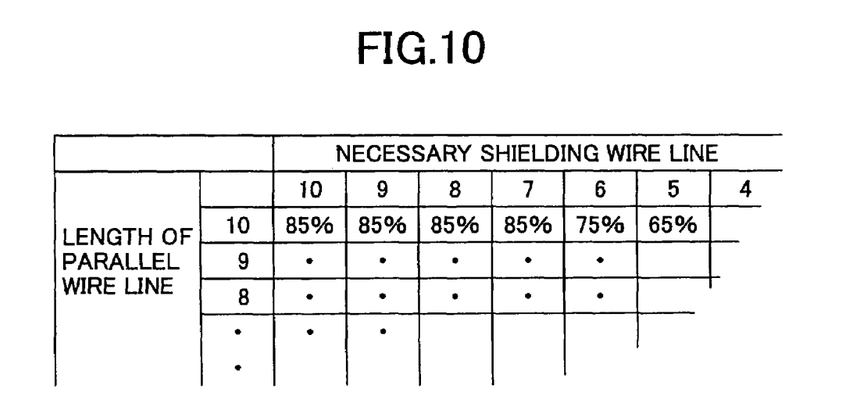
FIG. 10 is an example of a table that shows the relationship between the length of parallel shielding wire lines and the length of necessary shielding wire lines.

FIG. 10 is an example of a table that shows the relationship between the length of parallel shielding wire lines and the length of necessary shielding wire lines. In the example of FIG. 10, when a 75% delay reduction is desired under the condition of parallel wire lines being 10 mm in length, for example, it can be learned from the table that a length of 6 mm is necessary as a shielding wire line. If a 65% reduction of the delay is sufficient, for example, it can be learned that a length of 5 mm suffices as a shielding wire line. In addition to the parallel wire line length of 10 mm, a parallel wire line length of 9 mm, 8 mm, and so on are listed, for which lengths of shielding wire lines necessary for desired delay reduction ratios are provided in a table format. Further, a plurality of tables using coupling capacitances and resistances as parameters may be provided as a library, so that a table matching relevant conditions is selected to obtain the length of shielding wire lines necessary for desired delay reduction ratios.

The relationship between the parallel wire line length and the necessary shielding wire line length may be provided as a library in the form of approximating formulas.

If the tolerable delay is known, a minimum wire line length for securing a desired delay is selected to attain an efficient arrangement of shielding wire lines that occupies no more than a necessary wiring area. Even if the tolerable delay is unknown, it is apparent that the shielding of the entire length of 10 mm of the shielded wire line is not different from the shielding of a partial extent of 7 mm in terms of an effect of cross-talk reductions in the example of FIG. 10. In such a case, a shield length of 7 mm may be selected so as to achieve shielding that makes efficient use of wiring areas.

Further, the present invention is not limited to these embodiments, but various variations and modifications may be made without departing from the scope of the present invention.

The present application is based on Japanese priority application No. 2000-387890 filed on Dec. 20, 2000, with the Japanese Patent Office, the entire contents of which are hereby incorporated by reference.

What is claimed is:

1. A semiconductor-integrated circuit, comprising:
   a shielded wire line arranged in a wiring layer of the semiconductor-integrated circuit;
   two first shielding wire lines disposed entirely in the wiring layer, arranged side by side and that shield the shielded wire line on one side of the shielded wire line; and
   two second shielding wire lines disposed entirely in the wiring layer, arranged side by side and that shield the shielded wire line on another side of the shielded wire line, the first two shielding wire lines being directly opposed to the second two shielding wire lines across the shielded wire line, wherein each of the first two shielding wire lines and each of the second two shielding wire lines are electrically coupled to a fixed potential, and wherein the shielded wire line, the two first shielding wire lines, and the two second shielding wire lines extend substantially parallel to each other;
   wherein each of the two first shielding wire lines and the two second shielding wire lines are electrically and physically divided into a plurality of segments in a longitudinal direction of the shielded wire line.

* * * * *